(12) United States Patent
Aton et al.

(10) Patent No.: US 6,813,757 B2
(45) Date of Patent: Nov. 2, 2004

(54) METHOD FOR EVALUATING A MASK PATTERN ON A SUBSTRATE

(75) Inventors: Thomas J. Aton, Dallas, TX (US); Mi-Chang Chang, Hsinchu (TW)

(73) Assignee: Texas Instruments Incorporated, Dallas, TX (US)

(*) Notice: Subject to any disclaimer, the term of this patent is extended or adjusted under 35 U.S.C. 154(b) by 257 days.

(21) Appl. No.: 10/113,403

(22) Filed: Apr. 1, 2002

(65) Prior Publication Data

US 2003/0084420 A1 May 1, 2003

Related U.S. Application Data

(60) Provisional application No. 60/353,297, filed on Oct. 25, 2001.

(51) Int. Cl.[7] .............................................. G06F 17/50
(52) U.S. Cl. ......................................... 716/19; 716/20
(58) Field of Search ........................ 716/19–21; 430/30; 250/492.22; 382/144

(56) References Cited

U.S. PATENT DOCUMENTS

| | | | | |
|---|---|---|---|---|
| 5,885,748 A | * | 3/1999 | Ohnuma ..................... 430/296 |
| 6,081,658 A | * | 6/2000 | Rieger et al. ................. 716/21 |
| 6,492,066 B1 | * | 12/2002 | Capodieci et al. ............ 430/5 |
| 6,643,616 B1 | * | 11/2003 | Granik et al. ................ 703/13 |

* cited by examiner

Primary Examiner—Leigh M. Garbowski
(74) Attorney, Agent, or Firm—Peter K. McLarty; W. James Brady, III; Frederick J. Telecky, Jr.

(57) ABSTRACT

A method for evaluating a mask pattern for a product that is manufactured by a process that is described at least in part by a mathematical process model includes the steps of: (a) selecting a reference locus; (b) determining a sampling direction from the reference locus; (c) selecting a sampling locus in the sampling direction; (d) evaluating a model factor at the sampling locus; and (e) applying at least one predetermined criterion to the model factor to determine a conclusion. If the conclusion is a first inference, (f) repeating steps (c) through (e). If the conclusion is a second inference, (g) determining whether the evaluation is complete and repeating steps (a) through (g) until the evaluating is complete.

21 Claims, 4 Drawing Sheets

METHOD FOR EVALUATING A MASK PATTERN ON A SUBSTRATE

This application claims benefit of prior filed copending Provisional Patent Application Ser. No. 60/353,297, filed Oct. 25, 2001.

BACKGROUND OF THE INVENTION

The present invention is directed to electrical circuit fabrication, and especially to quality checking circuit mask layouts. The present invention is particularly valuable when employed in connection with manufacturing very large scale integrated (VLSI) circuits.

When fabricating circuits, such as circuits in a semiconductor device, one commonly begins with a database of drawn patterns representing the desired shape of the pattern to be transferred to a substrate to create one portion of the device. The desired pattern is transferred to the device through what is commonly referred to as a photolithographic process. Photoresist material is applied to the substrate, commonly by a spinning-on process. The photoresist material is then patterned using a mask having transparent areas and opaque areas which generally correspond to the shapes of the desired pattern of polygons in the circuit database. The mask is commonly fabricated of a quartz material, and the opaque areas are created on the quartz material using chromium so as to shadow predetermined areas of the photoresist from illuminating light. The substrate and photoresist assembly is exposed to light and then developed using a chemical process. Areas shadowed (i.e., by the chromium areas on the quartz mask) remain after the developing process. Light-exposed portions of the photoresist (i.e., areas beneath transparent quartz areas of the mask) are removed by the developing process.

Some areas of the photoresist material do not conform precisely with the desired pattern in the database. Such incongruities may occur because of light diffraction effects at the mask and other factors of chemical, optical and other natures. Modeling approaches have been employed to seek to predict, identify or correct such a lack of incongruity between the desired database pattern and the pattern transferred to the wafer. Such prior art modeling attempts have met with moderate success. Techniques generally known as proximity correction techniques, including optical proximity correction (OPC) techniques are sometimes employed to modify the pattern to be placed on the mask (i.e., the mask pattern) to one different than that of the database pattern. The modifications are carried out to counteract the distortion effect of the photolithographic process and produce a printed pattern on the substrate more closely matching the desired database pattern. However, it is difficult to determine whether the modified patterns of the mask properly reduce the incongruities between the database pattern and the printed pattern on the substrate. Proximity correction techniques may interfere with presently known prior art approaches used to predict or identify areas of incongruity.

There is a need for a method or technique for evaluating a mask pattern to predict or determine whether the printed pattern produced by the mask is within acceptable limits of incongruity with an associated database pattern, especially when the associated mask pattern employs proximity correction techniques, including optical proximity correction (OPC) techniques.

SUMMARY OF THE INVENTION

A method for evaluating a mask pattern for a product that is manufactured by a process that is described at least in part by a mathematical process model includes the steps of: (a) selecting a reference locus; (b) determining a sampling direction from the reference locus; (c) selecting a sampling locus in the sampling direction; (d) evaluating a model factor at the sampling locus; and (e) applying at least one predetermined criterion to the model factor to determine a conclusion. If the conclusion is a first inference, (f) repeating steps (c) through (e). If the conclusion is a second inference, (g) determining whether the evaluation is complete and repeating steps (a) through (g) until the evaluating is complete.

It is, therefore, an object of the present invention to provide a method for evaluating a mask pattern to predict or determine whether the printed pattern to be produced by the mask is within acceptable limits of incongruity with its associated database pattern, especially when the associated mask pattern employs proximity correction techniques, including optical proximity correction (OPC) techniques.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
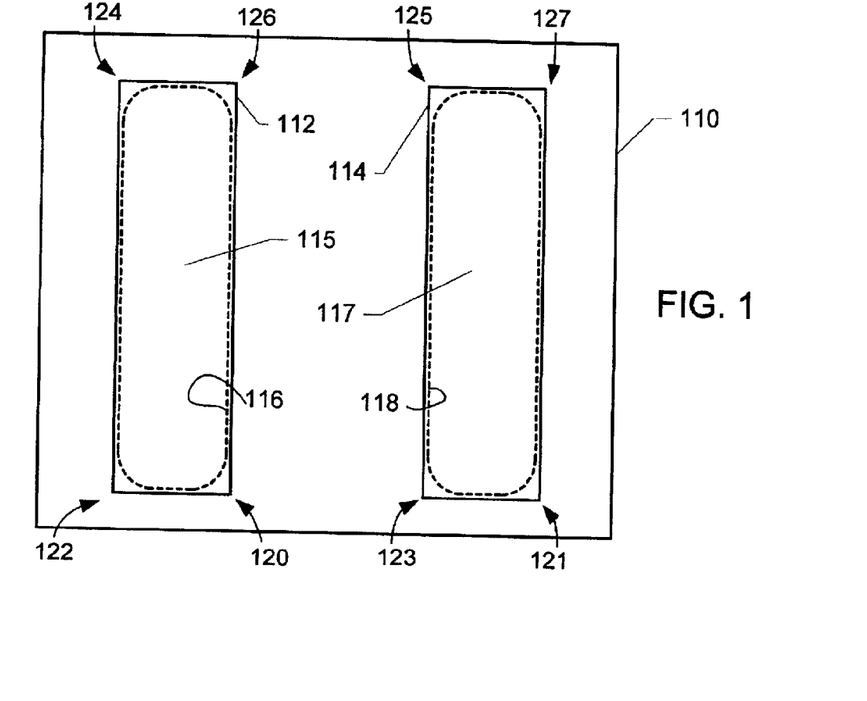
FIG. 1 is a schematic plan diagram illustrating a typical relationship between a database pattern, a mask and a printed pattern resulting on a substrate after circuit fabrication using the mask.

FIG. 1 is a schematic plan diagram illustrating a typical relationship between a database pattern, a mask and a printed pattern resulting on a substrate after circuit fabrication using the mask. In FIG. 1, a database pattern transferred directly to a transparent mask 110 is manifested in a pattern of opaque lands 112, 114. When mask 110 is placed near a substrate having photoresist material arrayed on its surface facing mask 110 (not shown in FIG. 1) and exposed to light to expose the photoresist material on the substrate, opaque land 212 will "shadow" a portion of the photoresist material on the substrate substantially in a process or printed pattern 115 bounded by a boundary 116, and opaque land 114 will "shadow" a portion of the photoresist material on the substrate substantially in a process or printed pattern 117 bounded by a boundary 118. Process patterns 115, 117 do not conform precisely with opaque lands 112, 114 because of diffraction of light as it passes opaque lands 112, 114 through mask 110, and because of other factors of chemical and other natures.

Deviations between process patterns 115, 117 and opaque lands 112, 114 are particularly noticeable in the vicinities of corners of opaque lands 112, 114, as for example at corners 120, 122, 124, 126 of opaque land 112 and at corner 121, 123, 125, 127 of opaque land 114.

Figure 2:
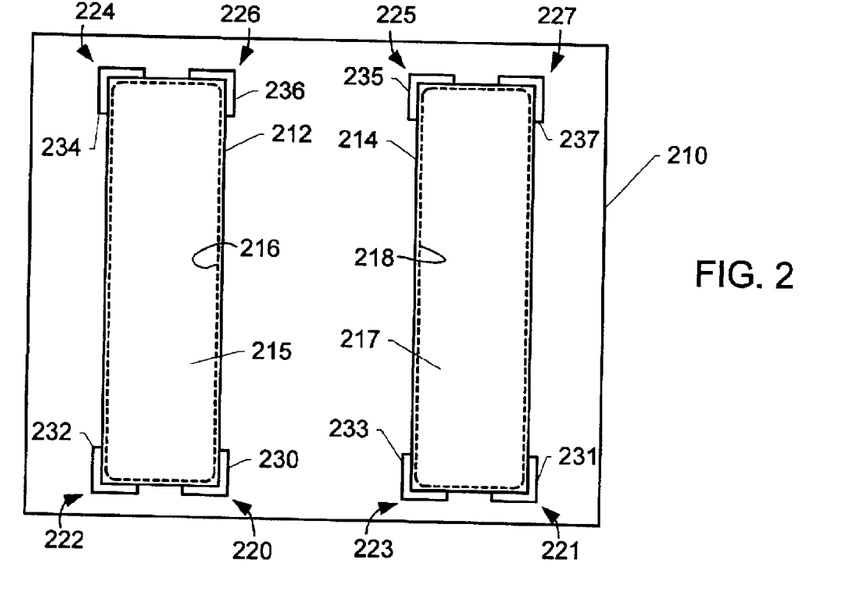
FIG. 2 is a schematic plan diagram illustrating employment of a first representative proximity correction technique in modifying the database pattern of FIG. 1 for placement on a mask for improving the associated printed pattern.

FIG. 2 is a schematic plan diagram illustrating employment of a first representative proximity correction technique in modifying the database pattern of FIG. 1 for placement on a mask for improving the associated printed pattern. There are several techniques that are known by those skilled in the art of semiconductor manufacturing processes for reducing differences between opaque lands on semiconductor masks and their associated printed, or process patterns of non-exposed photoresist material created during exposure to light of photoresist material arranged on a substrate near the mask during semiconductor manufacturing. The techniques are generally referred to as proximity correction techniques and include Optical Proximity Correction (OPC) techniques. One Optical Proximity Correction (OPC) technique employed to improve congruence between a database pattern and its associated process pattern is to place a serif on the mask at the corners of opaque lands on the mask. In FIG. 2, a transparent mask 210 is patterned with opaque lands 212, 214. When mask 210 is placed near a substrate having photoresist material arrayed on its surface facing mask 210 (not shown in FIG. 2) and exposed to light to expose the photoresist material on the substrate, opaque land 212 will "shadow" a portion of the photoresist material on the substrate substantially in a process pattern 215 bounded by a boundary 216, and opaque land 214 will "shadow" a portion of the photoresist material on the substrate substantially in a process pattern 217 bounded by a boundary 218.

Serif structures 230, 232, 234, 236 are provided at corners 220, 222, 224, 226 of opaque pattern 212. Each serif structure 230, 232, 234, 236 is configured substantially in an "L" shape to generally abut its respective corner 220, 222, 224, 226 of opaque mask 212. Serif structures 231, 233, 235, 237 are provided at corners 221, 223, 225, 227 of opaque pattern 214. Each serif structure 231, 233, 235, 237 is configured substantially in an "L" shape to generally abut its respective corner 221, 223, 225, 227 of opaque mask 212.

Process patterns 215, 217 do not conform precisely with opaque lands 212, 214 because of diffraction of light as it passes opaque lands 212, 214 through mask 212, and because of other factors of chemical and other natures. However, deviations between process patterns 215, 217 and the original database pattern, as represented by opaque lands 112, 114 (FIG. 1) are reduced in the vicinities of corners of opaque lands 212, 214, as compared to the deviations experienced in connection with process patterns 115, 117 with respect to the mask made from the original database pattern transferred to opaque lands 112, 114 in which no proximity correction techniques are employed (FIG. 1). Deviations between process patterns and associated database patterns are, for example, reduced (in comparison with such deviations in FIG. 1) at corners 220, 222, 224, 226 of opaque land 212 and at corners 221, 223, 225, 227 of opaque land 214.

Figure 3:
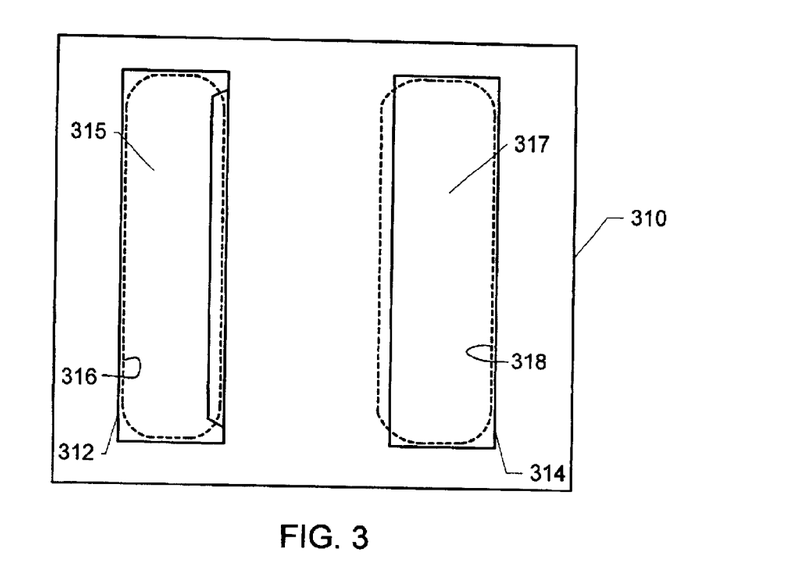
FIG. 3 is a schematic plan diagram illustrating employment of a second representative proximity correction technique in modifying the database pattern of FIG. 1 for placement on a mask for improving the associated printed pattern.

Another circumstance that sometimes occurs during semiconductor processing is an effect known as "scumming". Scumming is usually manifested as an "attraction" of photoresist material between process patterns that are closely situated on a substrate. Proximity correction techniques have been developed to cope with the occurrence of scumming. FIG. 3 is a schematic plan diagram illustrating employment of a second representative proximity correction technique in modifying the database pattern of FIG. 1 for placement on a mask for improving the associated printed pattern. In FIG. 3, a transparent mask 310 is patterned with opaque lands 312, 314. When mask 310 is placed near a substrate having photoresist material arrayed on its surface facing mask 310 (not shown in FIG. 3) and exposed to light to expose the photoresist material on the substrate, opaque land 312 will "shadow" a portion of the photoresist material on the substrate substantially in a process pattern 315 bounded by a boundary 316, and opaque land 314 will "shadow" a portion of the photoresist material on the substrate substantially in a process pattern 317 bounded by a boundary 318.

Opaque land 314 is substantially a rectangle, as were opaque lands 114, 214 (FIGS. 1 and 2). However, in the semiconductor circuit manufactured using mask 310, process pattern 317 is "attracted" toward process pattern 315 so that boundary 318 extends beyond the "footprint" of opaque land 314 toward process pattern 315. This is an example of scumming. The "footprint" of opaque land 314 is an area beneath opaque land 314 on a neighboring substrate (not shown in FIG. 3) that is substantially in register with opaque land 314.

Opaque land 312 has been modified using a proximity correction technique known by those skilled in the art of semiconductor fabrication techniques to remove a "slice" of material from the side of opaque pattern 312 that faces opaque pattern 314. Such removal of material from opaque land 312 causes process pattern 315 to substantially conform to the original database pattern represented by opaque land 312 (FIG. 1). That is, removing the slice from opaque land 312 corrected the scumming that would have occurred in process pattern 315 had no proximity correction (i.e., removing the slice) been applied to opaque land 312.

Other proximity correction techniques are employed to correct for inaccuracies that might otherwise occur in developing a semiconductor product using photoresist on a substrate and an associated mask illuminated to develop the photoresist on the substrate. The problem is that applying the proximity correction techniques renders inaccurate any calculations relating to spacing, alignment and other parameters for placement of circuit elements in a mask. That is, one may calculate that certain placements of opaque lands should be established to satisfy certain design criteria such as voltage potential limitations or RF interference limitations. However, such effects as scumming or nonalignment of process patterns with opaque lands render the resulting circuit-product invalid and unworkable. Mask designers may respond to the occurrence of such inaccuracies by applying proximity correction techniques (such as serifs or slice removal or other techniques not enunciated herein) to correct for the observed (or calculated) inaccuracies. The elimination of such inaccuracies is particularly necessary and valuable in today's circuits because of the multi-layers, the density on a substrate, the density between substrates and other effects of miniaturization and finer resolutions used in today's processes and products.

However, introduction of proximity correction techniques into design of a mask for a semiconductor circuit-product exacerbates the complexity of the design by complicating calculations that must be carried out to ensure proper spacing, situating and other considerations among circuit components in various layers.

Figure 4:
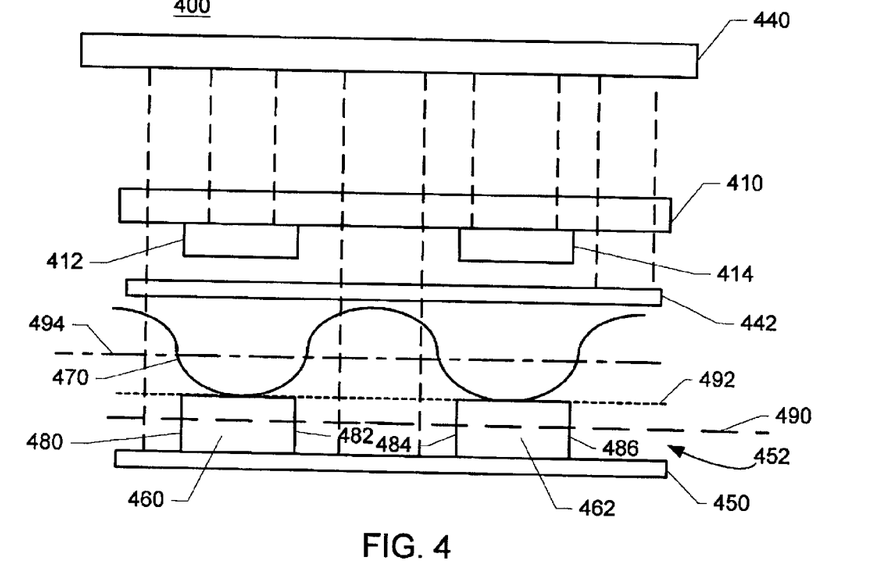
FIG. 4 is a schematic diagram illustrating a representative step in the fabrication process with which the present invention is advantageously employed.

An understanding of certain aspects of semiconductor circuit-product fabrication is helpful for understanding the present invention. FIG. 4 is a schematic diagram illustrating a representative step in the fabrication process with which the present invention is advantageously employed. In FIG. 4, a semiconductor fabricating system 400 includes a transparent mask 410 with opaque lands 412, 414. Preferably and typically opaque lands 412, 414 are embodied in chromium. A light source 440 illuminates a substrate 450 through a lens 442; lens 442 focuses light from light source 440 upon substrate 450. Substrate 450 has photoresist material 452 deposited on its upper surface, preferably by a process such as spinning photoresist material 452 on substrate 450. Photoresist material 452 is spun on (or otherwise applied) to substrate 450 to an initial height indicated by a dotted line 492. When photoresist material 452 is exposed to light from light source 440 a pattern is created on substrate 450. Following a developing process (not illustrated in FIG. 4), photoresist material that is "shadowed" by opaque lands 412, 414 remains in place substantially to the depth indicated by dotted line 492, and areas of photoresist material 452 that are exposed to light from light source 440 are substantially eliminated. In such a manner, following the development process not discussed in detail herein, process patterns manifested in circuit components 460, 462 are created on substrate 450 substantially in the pattern of opaque lands 412, 414 on mask 410.

Light intensity during the illumination of photoresist material 452 by light source 440 through mask 410 and lens 442 varies across the expanse of substrate 450. Light intensity variation is schematically indicated by a light intensity line 470 in FIG. 4. Light intensity line 470 indicates that light intensity varies from a low value in the vicinity of circuit components 460, 462 to a high value in the vicinity of areas in which photoresist material 452 is exposed by light source 440 through mask 410 and lens 442. That is, light intensity is lowest in the "shadowed" areas provided by opaque lands 412, 414. Light is at is lowest intensity substantially midway between boundaries 480, 482 of circuit component 460 and substantially midway between boundaries 484, 486 of circuit component 462. Light is at its highest intensity, for example, substantially midway between boundary 482 of circuit component 462 and boundary 484 of circuit component 462. A threshold intensity level, as for example indicated by an intensity level 494 in FIG. 4, determines whether photoresist material 452 is sufficiently exposed to effect its elimination during a subsequent development step.

Determining a desired application of proximity correction techniques is generally carried out using one of two methods, or a combination of the two methods: model-based correction and rule-based correction. Model-based correction may be carried out by regarding a plurality of segments or loci in a mask and employing a mathematical model of the pattern resulting from light exposure through the mask to calculate whether a correction should be applied. Such a model-based approach requires a detailed mathematical model of the particular mask to be corrected as well as of the pattern that results from the exposure of a substrate through the mask. Rule-based correction is generally based only on measurements of the geometries in the database patterns. Rule-based correction generally involves steps such as measuring gaps between circuit components (i.e., database patterns) in the intended circuit-product (that is, in the circuit portion intended to be produced for a particular layer of photoresist fabricated in a particular iteration of the semiconductor manufacturing process). Proximity correction measures (e.g., serifs, removing slices or other techniques) are incorporated into the mask design when certain spacing or other predetermined rules are violated.

The exposure of photoresist material 452 using semiconductor fabricating system 400 is typically employed numerous times with different masks 410 controlling exposure of selected areas (and "shadowing" of other selected areas) in creating a semiconductor device. Exposed photoresist material is developed following each iterative exposure step and another layer of photoresist material 452 may be spun on (or otherwise applied) over the then extant circuit pattern for use in a subsequent iterative exposure step using another mask 410. It is not uncommon for a semiconductor device to involve twenty or more iterations of the iterative exposure-development process. Semiconductor devices fabricated in such manner may involve one hundred thousand parts or more. It is because of such high part density that control of spacing and orientation of circuit components (i.e., process patterns) is of critical importance in semiconductor fabrication processes.

Attempting to apply a model-based correction approach to such a high part-count semiconductor device would be overwhelming and demand more computation capacity than is reasonable for an economically feasible manufacturing operation. That is, the computer resources would be too great and the time required for carrying out the required computations would be too long to enable a manufacturer to economically practice model-based correction techniques for all layers or even for some layers for such high-density semiconductor products as are commonly produced for today's market.

Rule-based correction presents its own set of problems. The rules for incorporation of proximity corrections are based only on the geometrical patterns in the database. It is difficult to ensure that the rules comprehend the large variety of database pattern arrangements that will typically be present in modern integrated circuit (IC) design patterns. Because a finite set of human-generated rules are used for a rule-based correction technique, subtle variations in other geometries near the geometries being corrected may produce process patterns that fail to meet the required process pattern quality control defined by the rules. Such a result is, in fact, not uncommon. Proximity correction measures can yield circumstances that a rulemaker never contemplated because of interactive effects of the large variety of geometry patterns encountered in a semiconductor product.

There is a need for a method for checking a mask pattern for use in semiconductor device fabrication, especially after application of proximity correction measures. The method should enable a mask designer to identify problems commonly encountered in semiconductor fabrication. Examples of such problems include, by way of example and not by way of limitation, gaps that may print too small, or gaps that may pull back too much, or line widths that are too small.

Figure 5:
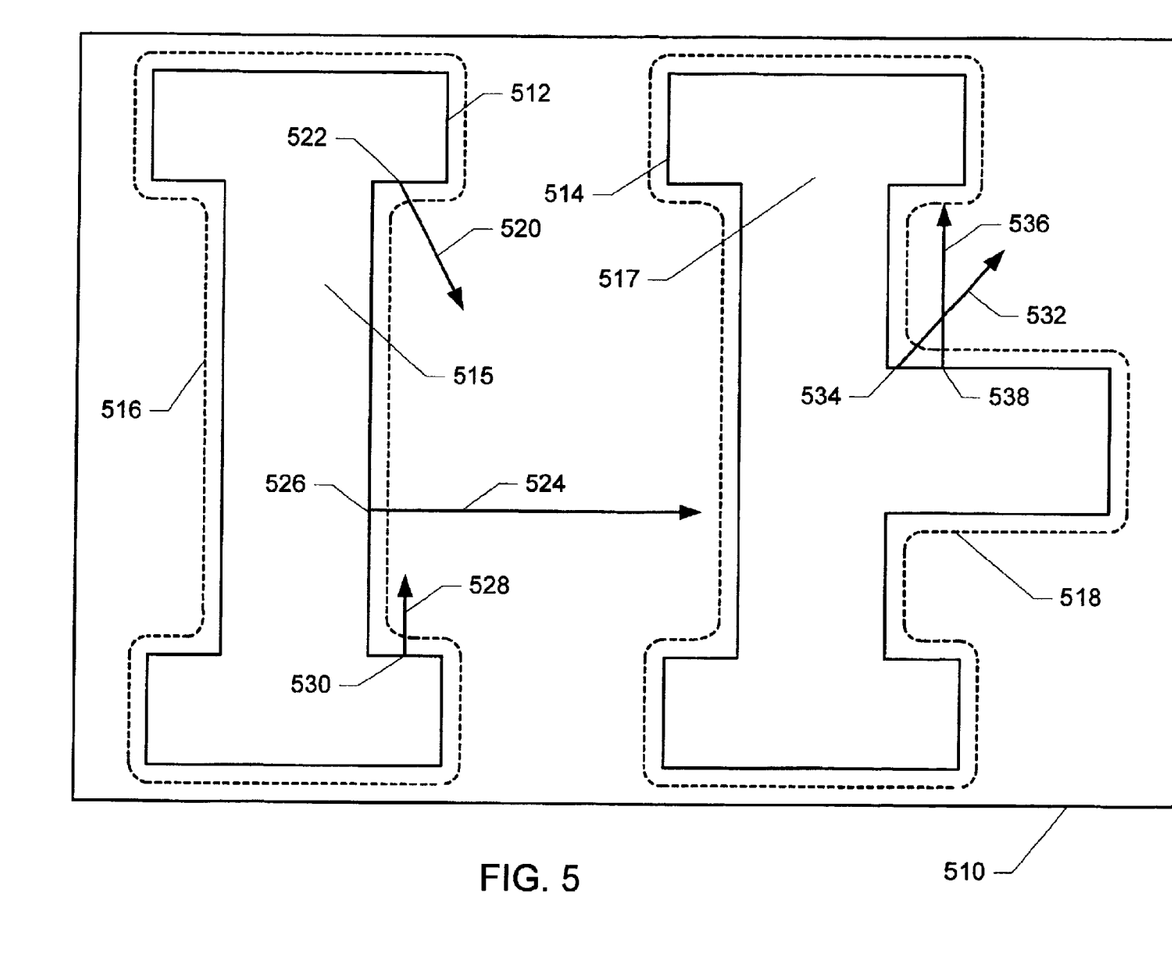
FIG. 5 is a schematic plan diagram of a representative mask with selected pattern contours and indications of exemplary sampling directions that may be considered for use with the present invention.

FIG. 5 is a schematic plan diagram of a representative mask with selected pattern contours and indications of exemplary sampling directions that may be considered for use with the present invention. In FIG. 5, a mask 510 is transparent and is patterned with opaque lands 512, 514. When mask 510 is placed near a substrate having photoresist material arrayed on its surface facing mask 510 (not shown in FIG. 5) and exposed to light to expose the photoresist material on the substrate, opaque land 512 will "shadow" a portion of the photoresist material on the substrate substantially in a process pattern 515 bounded by a boundary 516; opaque land 514 will "shadow" a portion of the photoresist material on the substrate substantially in a process pattern 517 bounded by a boundary 518. Process patterns 515, 517 do not conform precisely with opaque lands 512, 514 because of diffraction of light as it passes opaque lands 512, 514 through mask 510, and because of other factors of chemical and other natures. In order to simplify explaining the method of the present invention, the representative embodiment illustrated in FIG. 5 has boundaries 516, 518 exhibiting characteristics of "scumming" in extending beyond the "footprint" of opaque lands 512, 514. The "footprint" of opaque land 512 is an area beneath opaque land 512 on a neighboring substrate (not shown in FIG. 5) that is substantially in register with opaque land 512. The "footprint" of opaque land 514 is an area beneath opaque land 514 on a neighboring substrate (not shown in FIG. 5) that is substantially in register with opaque land 514.

Boundaries 516, 518 represent the contours of the printed patterns 515, 517 that will result in fabricating a semiconductor circuit-product on a substrate when using mask 510, generally as described in connection with FIG. 4. Such contours might, for example, represent the edge of the photoresist pattern. Mathematical curves approximating these contours (i.e., "model contours") may be generated by a mathematical model describing the lithographic or etch process used to carry out semiconductor circuit-product fabrication using mask 510 (i.e., a mathematical process model). The mathematical process model describing the model contours is usually available for use in generating proximity correction measures. The model contour is usually determined by a threshold value of a model factor that is provided by the mathematical process model indicating the printed pattern on a substrate when photoresist material is exposed through a mask, generally as described in connection with FIG. 4. The model factor is a factor generated by the mathematical process model that involves a number of parameters associated with the manufacturing process, including by way example and not exclusion:

- light effects during exposure processing including diffraction and reflection;
- properties of resist material employed in the product including chemical properties of the resist material and chemical properties extant during development of the resist material;
- properties of etchant material used to manufacture of the product, including the effect of pattern density upon the etching process; and
- topology of the product, including underlying layers, reflectivity, and step height of patterns.

The value of the model factor indicates whether a locus is inside or outside of a particular model contour, and may be designed to indicate proximity to a model contour.

The method of the present invention provides a facility for examining the geometrical patterns of an proximity-corrected mask database associated with a manufacturing process model to determine whether the model predicts that the mask data base might fail to properly pattern during a semiconductor patterning process. In a preferred embodiment, the method will determine whether a given selected point is inside the model contour or outside the model contour of a particular mask. Other criteria of success or failure may be substituted as may occur to those skilled in the art of IC manufacture. Broadly stated, the method of the present invention includes the steps of: (1) providing a mathematical process model for a process for manufacturing a product; (2) selecting a starting point or locus on a mask representation; (3) determining a direction of search; (4) computing a model factor along the selected search direction at one or more sample loci; (5) determining pass/fail of the mask pattern by the model factor computed at selected loci of the one or more sample loci; and (6) repeating steps (2) through (5) until the mask being checked is sufficiently evaluated. In describing the method herein the description will employ the terms "contour", "intensity" and similar terms to refer to those quantities as generated by the mathematical process model that represents the process for manufacturing the product being evaluated.

In a preferred embodiment of the present invention, the direction of search (step (2) above) may be chosen to be substantially perpendicular with the contour at the starting locus—that is, along the gradient of the model factor. The term "gradient" is used here to indicate a direction perpendicular with the model contour. Examples of such preferred perpendicular search directions are illustrated in FIG. 5. Thus, a search direction 520 from a measurement locus 522 is substantially perpendicular with contour 516. A search direction 524 from a measurement locus 526 is substantially perpendicular with contour 516. A search direction 528 from a measurement locus 530 is substantially perpendicular with contour 516. A search direction 532 from a measurement locus 534 is substantially perpendicular with contour 518. A search direction 536 from a measurement locus 538 is substantially perpendicular with contour 518. However, the determination of the gradient search direction is computationally expensive. If a device has several hundred thousand devices in a pattern—not an uncommon situation—to determine the gradient one must calculate:

$$\hat{x}\frac{\partial}{\partial x} + \hat{y}\frac{\partial}{\partial y} = \vec{\nabla} \quad [1]$$

Where x and y are coordinates in a two dimensional area (e.g., the substrate being fabricated) and $$\vec{\nabla}$$

indicates the gradient direction at a point (x,y). Expression [1] is a differential equation that the computer must calculate as:

$$\frac{I_1 - I_2}{x_1 - x_2} + \frac{I'_1 - I'_2}{y_1 - y_2} = \vec{\nabla} \quad [2]$$

for each locus, where $I_a$ and $I_a'$ are model factor values at particular loci in the area and $x_a$, $y_a$ are particular coordinate values in the area (i.e., on the substrate being fabricated). The calculations required for a computer to determine the direction of the gradient may require prohibitive amounts of computing resources and take too long to be cost-effective in practice. For this reason other search directions may be substituted for the gradient direction in alternate embodiments of the method of the present invention.

Thus, the preferred embodiment of the method of the present invention contemplates determining, using a mathematical process model that includes application of proximity correction measures, whether a point is inside or outside the model contour and includes the steps of:

1. For a given point on the proximity-corrected polygon representing the mask being evaluated after the application of proximity correction measures, find a nearby point on the contour—a contour edge position.

A contour edge position may be determined, for example, by (a) computing the slope of the model factor pattern, (b) jumping to an estimated point, (c) computing the value of the model factor at the estimated point, and repeating steps (a) through (c) until "close enough" to the contour. "Close enough" is an indication that one is within a predetermined acceptable deviation of the model contour. Such a step-wise search for a contour edge position can be carried out as a straight out search perpendicular to the corrected polygon (as opposed to perpendicular to the contour) or a gradient search (i.e., perpendicular to the contour) for the closest point on the contour. Some other search direction may as well be employed so long as it identifies a contour edge position. The locus, or contour edge position identification can be determined by a combination of such approaches or other approaches. Further, whether a combination of approaches is used, whether a different combination of approaches is used or whether a single one of the approaches is used may be answered differently at different points on the proximity-corrected polygon representing the mask being evaluated.

2. Compute the gradient of the model factor or employ some other function that generates a direction for a search from the model contour edge position.

3. Compute the intensity at one or more sample loci along the search direction (determined in Step 2 above) at selected distances from the model contour edge position (determined in Step 1 above).

The computed model factors at the various sample loci along the search direction may be evaluated to establish the likelihood that there will be a problem. For example, if it is decided that pass/fail is to be determined by whether there is a problem at 100 nm (i.e., nanometers) along the search direction from the model contour edge position, one may first measure at 160 nm from the model contour edge position to determine whether there is a problem. If there is a problem, one may next measure at 120 nm from the model contour edge position. If a problem still exists, one may next measure at 110 nm from the model contour edge position. If no problem is determined to exist at 110 nm from the model contour edge position, then rather than carry out more measurements to pinpoint where the onset of the problem occurs, one may instead evaluate whether having a problem only 20 nm or less displaced from the model contour edge position may be acceptable. To carry such an estimation approach further, if the initial measurement at 160 nm is found to indicate acceptable conditions, then one may be able to conclude that there will be no problem.

4. Flag positions where the model factor fails to meet one or more measurement of an acceptable pattern generation (as measured in Step 3 above).

By practicing a method according to steps (1) through (4) above, points that, for example, lack a sufficient gap between adjacent model contours for neighboring process patterns are readily identified and flagged. Previous experience by the inventor has shown that using the gradient direction (which by definition is perpendicular to the model contour) yields few false indications of mask failure (an important criterion since too many false failure indications could act to hide real failures among a number of false failures. However, other simpler search directions that use less computing capacity and occupy less time may also be acceptable, as discussed above.

By way of example and not limitation, one may use rule-based determinations to focus evaluations on certain areas of the mask before using the computationally-intense gradient calculation approach described above. Less computationally-intense determinations of search direction (for example, perpendicular to the mask polygons) may be employed at other areas of the mask being evaluated. Similarly, a simpler method of choosing the starting location (such as starting at some point on the mask polygon) may be optionally employed at some or at all areas of the mask to save computation time associated with accurate location of a model contour edge.

As a further example, other criteria may be considered that permit skipping measurements in the vicinity of short spans of the polygon, as in the "crook" of the "I" shapes in FIG. 5 (e.g., at measurement locus 538). Such selective skipping of measurements may aid in avoiding false failure indications that could result by noting too-close positioning of another part of the same polygon. An example of such a situation is illustrated in connection with search direction 536 from measurement locus 538; FIG. 5.

Figure 6:
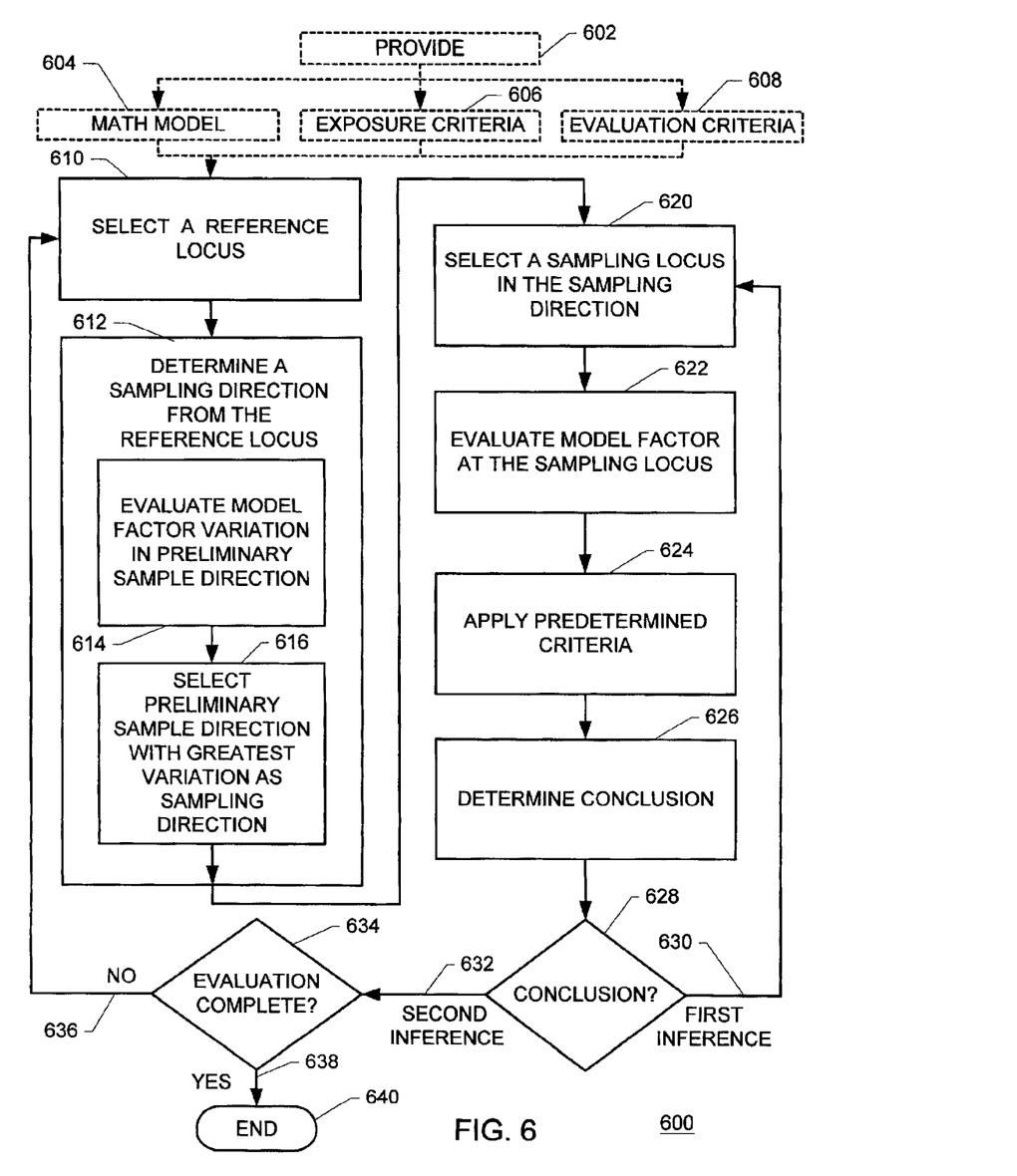
FIG. 6 is a flow diagram illustrating the present invention.

FIG. 6 is a flow diagram illustrating the present invention. In FIG. 6, a method 600 for evaluating a mask pattern on a substrate begins with the step of providing, as indicated by a block 602, in no particular order, a mathematical process model representing the process for manufacturing the product to be evaluated (as indicated by a block 604), at least one first evaluation criterion regarding desired model factor at respective loci relating to the mask pattern (as indicated by a block 606), and at least one second evaluation criterion regarding determining whether the evaluating is complete (as indicated by a block 608).

Method 600 continues by selecting a reference locus (as indicated by a block 610). Method 600 continues by determining a sampling direction from the reference locus (as indicated by a block 612), selecting a sampling locus in the sampling direction (as indicated by a block 620), evaluating a model factor to determine a locus model factor at the sampling locus (as indicated by a block 622), applying the at least one first evaluation criterion to the locus model factor (as indicated by a block 624) to determine a conclusion (as indicated by a block 626).

Method 600 continues by posing a query: "Does the conclusion (determined pursuant to block 626) raise a first inference or a second inference?", as indicated by a query block 628. If the conclusion raises a first inference, then method 600 continues via a "FIRST INFERENCE" response line 630 to repeat steps indicated by blocks 620, 622, 624, 626, 628. An exemplary first inference is an application of the at least one first evaluation criterion provided pursuant to block 606 to infer that further sampling is required in the sampling direction.

If the conclusion (determined pursuant to block 626) raises a second inference, then method 600 continues via a "SECOND INFERENCE" response line 632. An exemplary second inference is an application of the at least one first evaluation criterion provided pursuant to block 606 to infer that no further sampling is required in the sampling direction. Method 600 continues by posing a query "Is the evaluation complete?", as indicated by a query block 634, to apply the at least one second evaluation criterion provided pursuant to block 608. If the evaluation is not complete, method 600 continues via a "NO" response line 636 to repeat steps indicated by blocks 610, 612, 620, 622, 624, 626, 628, 634. If the evaluation is complete, method 600 continues via a "YES" response line 636 to end, as indicated by an "END" terminator 640.

As indicated in FIG. 6, a preferred practice for carrying out the step of determining a sampling direction from the reference locus (block 612) includes the steps of (1) calculating a model factor variation in at least one preliminary sample direction, as indicated by a block 614; and (2) selecting the particular preliminary sample direction of the at least one preliminary sample direction that has the greatest variation of the model factor as the sampling direction, as indicated by a block 616.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A method for evaluating a mask pattern for a product; said product being manufactured by a process; at least a part of said process being described by a mathematical process model; the method comprising the steps of, in said mathematical process model:
   (a) selecting a reference locus;
   (b) determining a sampling direction from said reference locus;
   (c) selecting a sampling locus in said sampling direction;
   (d) evaluating a model factor at said sampling locus;
   (e) applying at least one predetermined criterion to said model factor to determine a conclusion;
   (f) if said conclusion is a first inference, repeating steps (c) through (e);
   (g) if said conclusion is a second inference, determining whether said evaluation is complete; and
   (h) repeating steps (a) through (g) until said evaluating is complete.

2. A method for evaluating a mask pattern for a product as recited in claim 1 wherein said mask pattern includes at least one proximity correction feature; said model identifying a model contour; said model contour at least substantially circumscribing at least one selected portion of said mask pattern.

3. A method for evaluating a mask pattern for a product as recited in claim 2 wherein
   said sampling direction is substantially perpendicular to said model contour.

4. A method for evaluating a mask pattern for a product as recited in claim 2 wherein said mask pattern is comprised of a plurality of polygonal shapes defined by respective edges and wherein said sampling direction is substantially perpendicular to selected said edges.

5. A method for evaluating a mask pattern for a product as recited in claim 1 wherein said sampling direction is determined by the steps of:
   (1) calculating a model factor gradient in at least one preliminary sample direction from said reference locus; and
   (2) selecting the particular preliminary sample direction of said at least one preliminary sample direction having the steepest gradient as said sampling direction.

6. A method for evaluating a mask pattern for a product as recited in claim 1 wherein said first inference is that further sampling is required in said sampling direction.

7. A method for evaluating a mask pattern for a product as recited in claim 1 wherein
   said second inference is that no further sampling is required in said sampling direction.

8. A method for evaluating a mask pattern for a product as recited in claim 1 wherein said conclusion includes a determination whether said model factor determined according to step (d) is outside predetermined limits desired for said model factor at said sampling locus then extant.

9. A method for evaluating a mask pattern for a product as recited in claim 8 wherein said conclusion further includes flagging said sampling locus then extant when said model factor computation determined according to step (d) is outside predetermined limits desired for said model factor at said sampling locus then extant.

10. A method for evaluating a mask pattern for a product as recited in claim 9 wherein said conclusion further includes indicating by said flagging whether said model factor computation is higher or lower than said predetermined limits desired for said model factor at said sampling locus then extant.

11. A method for evaluating a mask pattern for a product as recited in claim 10 wherein said conclusion further includes indicating by said flagging by what amount said model factor computation is higher or lower than said predetermined limits for said model factor at said sampling locus then extant.

12. A method for evaluating a mask pattern for a product as recited in claim 2 wherein said sampling direction is determined by the steps of:
    (1) calculating a model factor gradient in at least one preliminary sample direction from said reference locus; and
    (2) selecting the particular preliminary sample direction of said at least one preliminary sample direction having the steepest gradient as said sampling direction.

13. A method for evaluating a mask pattern for a product as recited in claim 12 wherein said first inference is that further sampling is required in said sampling direction.

14. A method for evaluating a mask pattern for a product as recited in claim 13 wherein said second inference is that no further sampling is required in said sampling direction.

15. A method for evaluating a mask pattern for a product as recited in claim 14 wherein said conclusion includes a determination whether said model factor computation determined according to step (d) is outside predetermined limits desired for said model factor at said sampling locus then extant.

16. A method for evaluating a mask pattern for a product as recited in claim 15 wherein said conclusion further includes flagging said sampling locus then extant when said model factor computation determined according to step (d) is outside predetermined limits desired for said model factor at said sampling locus then extant.

17. A method for evaluating a mask pattern for a product as recited in claim 16 wherein said conclusion further includes indicating by said flagging whether said model factor computation is higher or lower than said predetermined limits for said model factor at said sampling locus then extant.

18. A method for evaluating a mask pattern for a product as recited in claim 17 wherein said conclusion further includes indicating by said flagging by what amount an exposure intensity computation is higher or lower than said predetermined limits for said model factor at said sampling locus then extant.

19. A method for evaluating a mask pattern for a product; the method comprising the steps of:
    (a) in no particular order:
       (1) providing a mathematical process model representing a process for manufacturing said product; said process including application of at least one proximity correction feature;

(2) establishing at least one first evaluation criterion regarding a desired model factor at respective loci relating to said mask pattern; and (3) establishing at least one second evaluation criterion regarding determining whether said evaluating is complete;

(b) selecting a reference locus;

(c) determining a sampling direction from said reference locus;

(d) selecting a sampling locus in said sampling direction;

(e) evaluating said model factor to determine a locus model factor at said sampling locus;

(f) applying said at least one first evaluation criterion to said locus model factor to determine a conclusion;

(g) if said conclusion is a first inference, repeating steps (d) through (f);

(h) if said conclusion is a second inference, applying said at least one second evaluation criterion to determine whether said evaluating is complete; and (i) repeating steps (b) through (h) until said evaluating is complete.

20. A method for evaluating a mask pattern for a product as recited in claim 19 wherein said sampling direction is determined by the steps of:

(1) calculating an model factor gradient in at least one preliminary sample direction from said reference locus; and (2) selecting the particular preliminary sample direction of said at least one preliminary sample direction having the steepest gradient as said sampling direction.

21. A method for evaluating a mask pattern for a product; said product being manufactured by a process; at least a part of said process being described by a mathematical process model; the method comprising the steps of, in said mathematical process model:

(a) selecting a reference locus;

(b) determining a sampling direction from said reference locus;

(c) selecting at least one sampling locus in said sampling direction;

(d) evaluating a model factor at said at least one sampling locus;

(e) applying at least one predetermined criterion to said model factor to determine a conclusion;

(f) if said conclusion is a first inference, repeating steps (c) through (e);

(g) if said conclusion is a second inference, determining whether said evaluation is complete; and (h) repeating steps (a) through (g) until said evaluating is complete.

* * * * *